United States Patent [19]

Kornreich et al.

[11] Patent Number: 4,972,248

[45] Date of Patent: Nov. 20, 1990

[54] MULTI-LAYER CIRCUIT STRUCTURE WITH THIN SEMICONDUCTOR CHANNELS

[75] Inventors: Phillip G. Kornreich, North Syracuse; Prasanta K. Ghosh, Syracuse, both of N.Y.

[73] Assignee: Syracuse University, Syracuse, N.Y.

[21] Appl. No.: 351,173

[22] Filed: May 11, 1989

[51] Int. Cl.$^5$ ............................................. H01L 27/02
[52] U.S. Cl. ........................................... 357/40; 357/4; 357/16; 357/71; 357/68; 357/75
[58] Field of Search .................. 357/4, 16, 71, 68, 65, 357/75, 76, 40

[56] References Cited

U.S. PATENT DOCUMENTS

| | | | |
|---|---|---|---|
| 3,613,226 | 10/1971 | Haisty et al. | 29/577 |
| 3,706,130 | 12/1972 | Sellbach et al. | 29/584 |
| 3,761,785 | 9/1973 | Pruniaux | 317/235 |
| 4,296,428 | 10/1981 | Haraszti | 357/41 |
| 4,309,811 | 1/1982 | Calhoun | 29/574 |
| 4,335,161 | 6/1982 | Luo | 427/86 |
| 4,381,201 | 4/1983 | Sakurai | 148/1.5 |
| 4,448,632 | 5/1984 | Akasaka | 156/603 |
| 4,467,518 | 8/1984 | Bansal et al. | 29/571 |
| 4,479,297 | 10/1984 | Mizutani et al. | 29/571 |
| 4,489,478 | 12/1984 | Sakurai | 29/574 |
| 4,498,226 | 2/1985 | Inoue et al. | 29/576 B |
| 4,502,202 | 3/1985 | Malhi | 29/571 |
| 4,596,604 | 6/1986 | Akiyama et al. | 148/1.5 |

*Primary Examiner*—William Mintel
*Attorney, Agent, or Firm*—Wall and Roehrig

[57] ABSTRACT

A three-dimensional multiple-circuit layer semiconductor device has multiple circuit layers vertically stacked on a single crystal wafer. Thick single-crystal InSb film serves as conductors and contacts, thin single-crystal InSb film serves as semiconductor channels, and CdTe serves as insulator layers. The good lattice match between the two materials permits epitaxial growth of fifty or more layers.

11 Claims, 3 Drawing Sheets

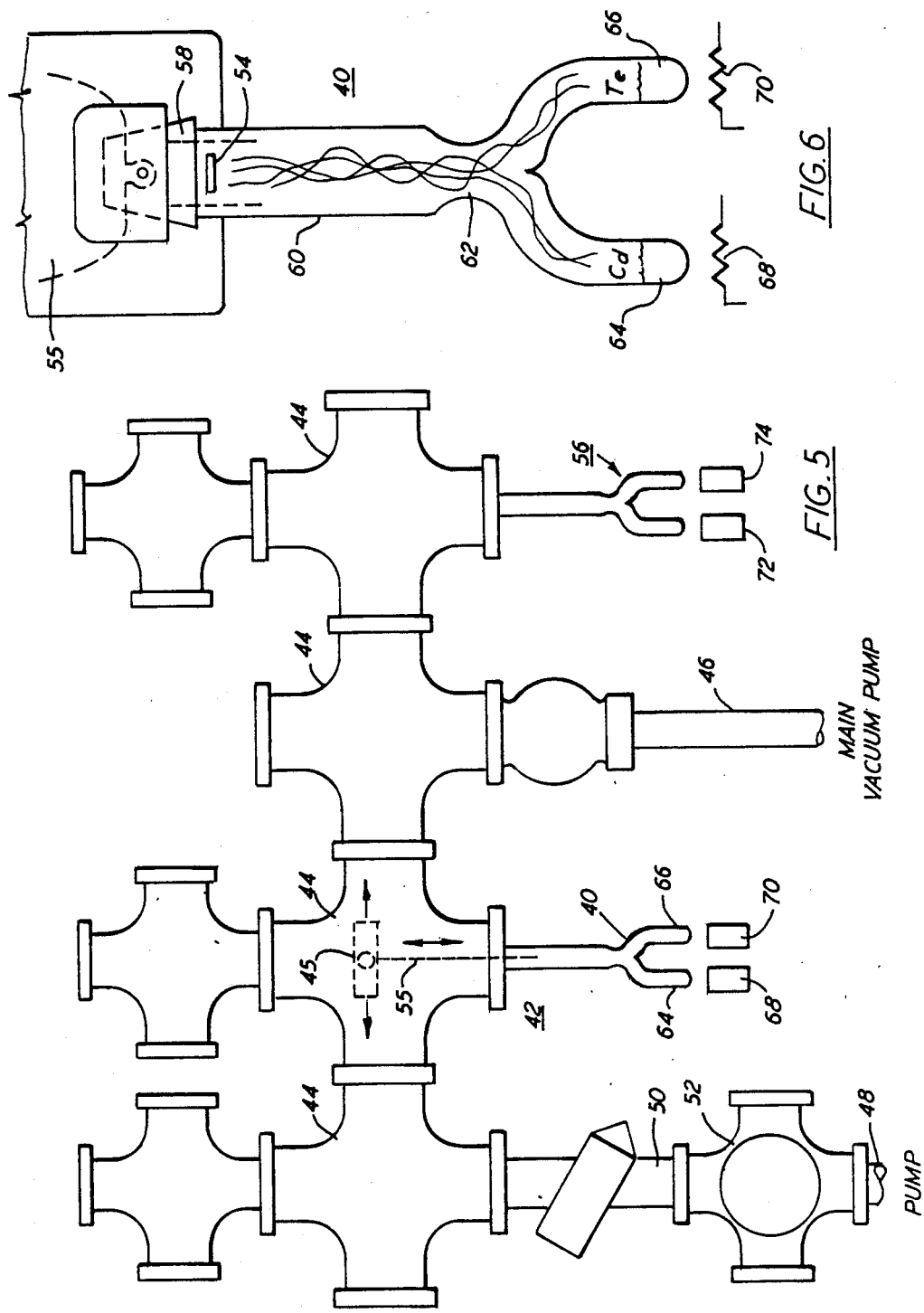

MULTI-LAYER CIRCUIT STRUCTURE WITH THIN SEMICONDUCTOR CHANNELS

BACKGROUND OF THE INVENTION

This invention relates to solid state integrated circuit construction and is more particularly directed to three-dimensional, epitaxially-grown vertical devices, i.e., multilayer semiconductor devices in which semiconductor, conductor and insulator layers are epitaxially grown or deposited one atop another on a substrate.

A vertical integrated circuit is typically formed of a number of alternate layers of semiconductor, metal (e.g. aluminum), and insulator (e.g. oxide). The metal and semiconductor at different levels are interconnected by means of metallic deposits that fill in grooves or bores etched through the multiple layers. Conventional methods of carrying out so-called three-dimensional integration are described, e.g. in U.S. Pats. Nos. 3,613,226; 4,335,161; 4,448,632; 4,596,604; 4,479,297; 4,489,478; and 4,467,518. In each of these, at least some of the layers are amorphous or polycrystalline. Consequently, there is no matching of the crystal lattice structure from one layer to the next. As a result, it is difficult to stack devices such as FETs more than two deep. Consequently, there has been only limited success in building true three-dimensional integrated circuits. Accordingly, for multiple level structures, it has been necessary to make integrated circuits on several wafers, stack the wafers one on top of another, and then connect vias for interconnection through the wafers. This is a complex and time consuming procedure, involving many different materials.

A number of elements or combinations of elements form a cubic zinc blende lattice structure, which is structurally similar to the diamond cubic structure of silicon and germanium. A number of "zinc blende" crystals include, in addition to ZnS, a number of semiconductor materials such as InP, InSb, InAs, GaAs, and others of the III-V type, as well as a number of crystals such as ZnSe, CdS, CdSe, and CdTe of the II-VI type. Each of these has its own characteristic lattice constant a. There are other crystals of similar structure, such as CuF, AgI, etc. made of elements of families outside the II-VI and III-V groups. SiC is an example of a IV—IV type. The electrical properties of these crystalline materials vary from one to the next, with some such as InSb being somewhat metallic at room temperature, others such as GaAs being semiconductors or semi-insulators, and still others such as CdTe being insulators or dielectrics. Each material has a characteristic band gap, which is known. Generally, the group III elements include Al, Ga, In, and Tl, and the type V elements include P, As, Sb, and Bi. The group II elements include Zn, Cd, and Hg, while group VI elements include S, Se, Te and Po. A type III-V material has one element selected from group III and another selected from Group V, while a type II-VI material has one element selected from group II and another selected from group VI.

It has long been desired to construct multi circuit layered vertical devices, which would have the advantage of having multiple devices in the same unit of substrate area now occupied by a single conventional device Because the devices are positioned close to one another in the vertical dimension it is also possible to reduce the power and the time required for transferring a bit of data from one to the next. Memory can be included in some of the layers Multi-circuit layer architecture is highly suited for large-scale parallel information processing.

However, conventional techniques employ a single-crystal substrate, metal conductors (Al or Au, for example), and oxide insulators (typically $SiO_2$ or $GeO_2$), so there are at least some amorphous or polycrystalline layers. There is no reliable way to grow a single-crystal semiconductor layer on a polycrystalline layer. Also, the lattice constant should be fairly closely matched from one layer to the next to obtain growth of monocrystalline layers. However, this is typically not the case, especially for silicon and quartz, which have quite different crystal structure and different lattice constants. Consequently, stacked devices have been limited to about two active elements per stack, and have had to employ polycrystalline silicon for device construction.

OBJECTS AND SUMMARY OF THE INVENTION

It is an object of this invention to produce a multiple circuit, true three-dimensional layered semiconductor device which avoids the drawbacks of the prior art.

It is another object of this invention to provide a multiple-circuit-layer type device in which there are only two materials employed.

It is a further object of this invention to provide a stacked semiconductor device in which the same material serves as semiconductor and as conductor, and the other material serves as insulator.

According to an aspect of this invention, a multiple layer semiconductor device comprises a single-crystal substrate and a plurality of stacked sandwiches of crystalline material. Each sandwich comprises a lower layer of a binary type single-crystal material, e.g., cadmium telluride, which serves as insulator, a thin layer of another binary type single-crystal material, e.g., indium antimonide, that serves as a semiconductor, and an upper layer of the first binary type material, e.g., cadmium telluride, serving as insulator. For very thin films of single-crystal indium antimonide, i.e. on the order of 100 Å or less, the material is a semiconductor at room temperature. However, bulk single-crystal indium antimonide has a metallic characteristic, and consequently thick deposits of this material can serve as ohmic contacts, leads, and as Schottky barrier gates. The sandwiched indium antimonide is a very thin film and can be the channel of a field effect transistor. The cadmium telluride insulator layers have grooves etched into them, into which the bulk indium antimonide is grown as source and drain contacts, and also as vias to connect vertically stacked devices. Indium antimonide/cadmium telluride field effect transistors can be biased such as to have either holes or electrons as the majority carrier in the thin-film channel, without having to dope the indium antimonide or the cadmium telluride. This permits construction of complementary switching circuits using single-design devices. Complementary switching circuits dissipate power only during switching. This is important in three-dimensional architecture where it is difficult to remove waste heat generated in the more centrally disposed circuit elements The materials should be selected to have as close to the same lattice constant as possible Cadmium telluride has a very low mismatch with respect to indium antimonide, on the order of only 0.04%.

The single crystal materials should be grown or deposited at a low enough temperature so as not to destroy the grown layer beneath it. In the case of cadmium telluride and indium antimonide, the layers can be epitaxially grown at relatively low temperatures, on the order of 250°-350° C. On the other hand to destroy the single crystal layers, temperatures of 500° to 700° C. are required. Thus, with these two compound materials, all the successive layers can be grown epitaxially as single crystals.

Because of the above properties, devices can be stacked ten to fifty deep. Vias between circuit layers can be incorporated where required.

The foregoing advantage is not attainable in conventional silicon, germanium, or gallium arsenide construction because of the inherent difficulty in growing epitaxial single crystal layers on non-crystalline or polycrystalline (i.e. metal conductor) layers. Further, because of high temperature processes employed for regrowth of epitaxial layers, diffusion, and annealing after ion implantation, buried layers can be destroyed or degraded. Silicon devices require non-crystalline oxide insulation layers, on which single crystal silicon layers cannot easily be regrown.

Because of the high electron mobility of InSb material and its high electron saturation velocity, it is possible to build faster devices and devices with higher power handling capability using InSb-CdTe heterostructure than can be built, e.g. with GaAs -AlGaAs heterostructures. It is estimated that InSb-CdTe heterostructure FETs can be built with cutoff frequencies about 400 GHz and drain current densities of 1.4 amperes per millimeter of gate width.

Many further objects, features and advantages of this invention will be more fully understood from the ensuing description of a preferred embodiment, when considered in connection with the accompanying Drawing.

BRIEF DESCRIPTION OF THE DRAWING

FIG. 5 is a side elevation of apparatus for epitaxially growing the multi-layer circuit structure of this invention.

FIG. 6 is a schematic elevation of a modified hot-wall epitaxial growth chamber according to an embodiment of this invention.

DETAILED DESCRIPTION OF THE PREFERRED EMBODIMENT

Figure 1:
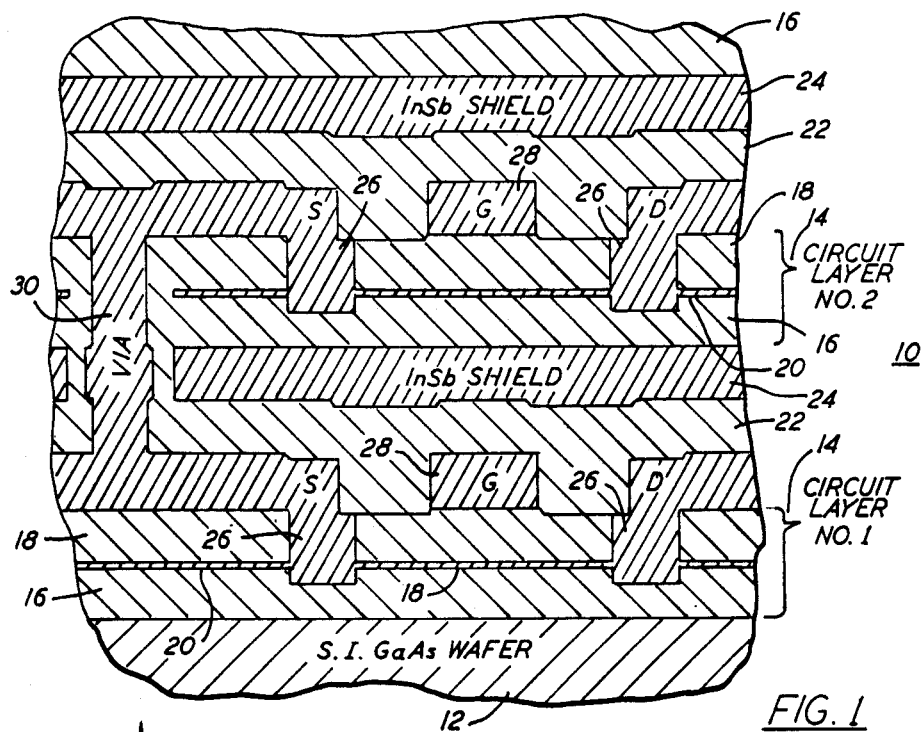
FIG. 1 is a schematic cross section of a multi-layer integrated circuit according to one preferred embodiment of this invention.

With reference to the Drawing and initially to FIG. 1 thereof, a true three-dimensional multi circuit layer device 10 is formed of a substrate 12 on which there are formed a number of stacked sandwiches 14,14 each having a lower layer 16 of an insulating single-crystal material, an upper layer 18 of that material, and, interposed between them, a very thin layer 20 of a semiconductor single crystal material. There are additional layers 22 of the insulating material. Bulk material layers 24 having metallic properties serve e.g., as isolation shields, and are interleaved between the stacked sandwiches 14.

Grooves are etched into the insulator layers 18 and the bulk material is grown in these grooves to form contacts 26 (e.g. source and drain electrodes) in contact with the thin semiconductor layer 20, which can serve as an FET channel. A gate electrode 28 formed of the bulk material can be grown epitaxially on the insulator layer 18. Vias 30 between the stacked circuit layers are epitaxially grown from the bulk metallic-property material, as are other conductors, which are not shown here.

In this embodiment the insulating layers 16, 18, 22 are of single-crystal CdTe, while the other elements 20, 24, 26, 28, 30 are formed of InSb. Bulk single-crystal InSb has almost metallic properties, while very thin (e.g., 100 Å) single crystal InSb films are semiconductors at room temperature. InSb-CdTe FETs can be biased in such a way as to have either holes or electrons as the majority carrier in the channel, without having to dope the InSb layers. This permits construction of complementary switching circuits by using only a single type of device. Such complementary switching circuits dissipate power only during switching and thus are desirable for stacked, three dimensional circuits where it is difficult to expel the waste heat generated in intermediate level circuits.

These single-crystal materials, i.e., InSb and CdTe, lend themselves readily to construction of multi-circuit layer structure, as the formation of new layers does not degrade the layers previously formed Indium antimonide and cadmium telluride can be grown epitaxially at relatively low temperatures, i.e., on the order of 300 degrees C. These materials are stable and will not begin to decompose until a much higher temperature in the range of 450 degrees C. to 700 degrees C. is attained. Accordingly, all layers, conductors, and vias of the device 10 can be grown epitaxially as single-crystalline material.

The substrate 12 in this embodiment is a semi-insulating gallium arsenide single-crystal wafer; however, other materials could be used, such as silicon. A CdTe or InSb wafer could also be employed and would provide an ideal lattice match for the sandwiches 14. However, such wafers would be extremely expensive at present and Si or GaAs provides an adequate substrate upon which single-crystal layers can be epitaxially grown.

Figure 2:
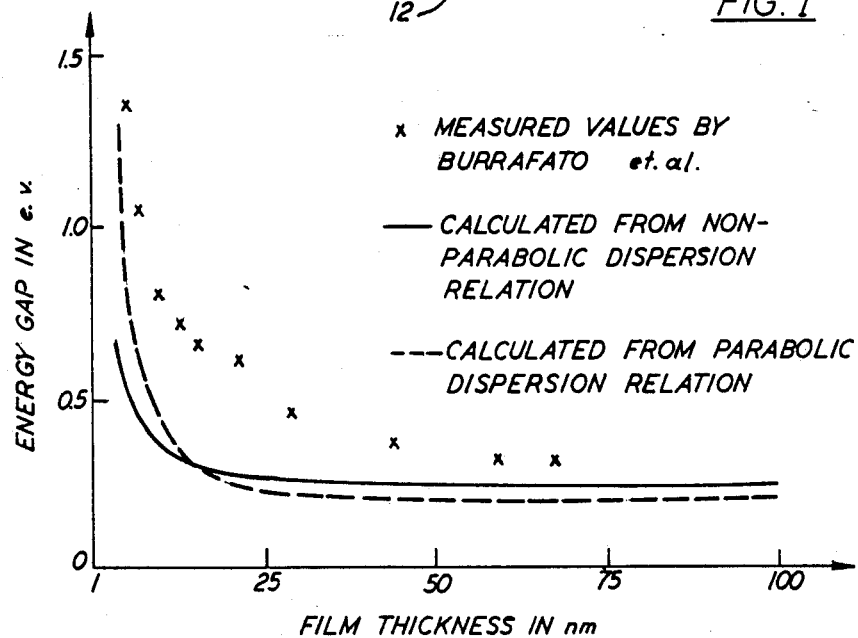
FIG. 2 is a plot of energy gap versus film thickness for InSb material.

Bulk indium antimonide (i.e. thick-film InSb) has an energy gap of only about 0.17 eV. Thus, at room temperature this material is intrinsically conductive Because of the quantum size effect, the energy gap expands with decreasing film thickness. This relationship has been measured and it is seen in FIG. 2 that the measured energy gap increases to a semiconductor level for film thicknesses below about 100 Å (10 nm). The measured values shown in "x"'s were reported in Burrafato et al., Quantum Size Effects and Band Structure in InSb, 37 J. Phys. Chem Solids, 519-523, 1976. The solid and dash line curves in FIG. 2 show predicted or theoretical band gap behavior from parabolic and nonparabolic dispersion relations.

The device 10 with multiple circuit layers on the single wafer 12 is constructed by growing the high quality CdTe-InSb-CdTe sandwich 14 on the semi-insulating wafer 12. In the sandwich, the layer 16 is typically about 1 to 2μm thick, and layer 18 is about 50 nm thick, and the InSb layer 20 is between 50 to 100 A thick, to serve as the FET channel of the first sandwich layer 14.

Figure 3:
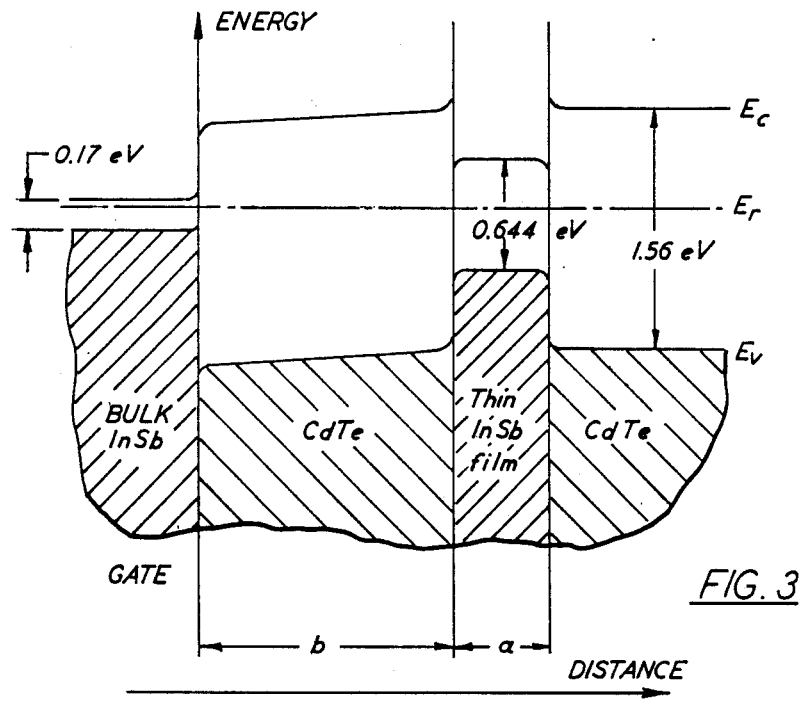
FIG. 3 is an energy profile of a circuit layer element of an embodiment of this invention.
Figure 4:
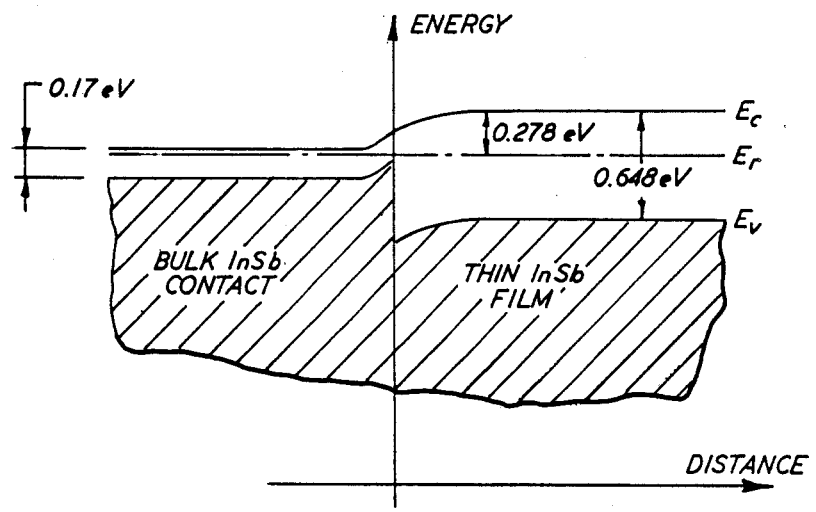
FIG. 4 is an energy profile of bulk InSb and thin-film InSb at an ohmic contact thereof at a zero bias.

FIG. 3 shows an energy profile of an InSb-CdTe FET with an InSb Schottky barrier gate contact (i.e., as in FIG. 1). The energy profile of the bulk InSb and thin film InSb at an ohmic contact is shown in FIG. 4. The energy gap for bulk InSb is 0.17 ev, and for thin film InSb is on the order of 0.6 to 0.7 ev. The bulk material is metallic or conductive at room temperature, while the thin film material is a semiconductor. The CdTe material has a rather high band gap, i.e., 1.56 ev, and thus acts as insulator material. Here, the film thickness a and b (not shown to scale) for the thin film InSb and the CdTe are about 7.5 nm and 50 nm, respectively. Biasing of the gate InSb material will influence the number and type of carriers in the thin film InSb, and hence affect its conductance characteristic. Other methods such as Molecular Beam Epitaxy or Chemical Vapor Deposition could also be used to construct these devices.

Table I sets out the characteristics of an InSb film and an intrinsic GaAs film. Where there is a difference based on film thickness, the bulk characteristics are given without parentheses, while the thin film (75 Å) characteristics appear in parentheses. InSb has approximately nine times the electron mobility $\mu_e$ and three times the hole mobility $\mu_h$ of GaAs. Also, there is a very close match of crystal lattice structure for InSb/CdTe (a mismatch of only 0.04%), three times better than GaAs/GaAlAs.

As indicated in Table II, InSb has a low resistivity making it suitable for contacts and conductors in the semiconductor device. The N-type InSb resistivity is lower than other materials, and is far lower than polysilicon. Figures for gold and aluminum are given for comparison. Aluminum, gold, and polysilicon would be unsuited for structure like that of this invention because their polycrystalline nature defies attempts to grow further layers epitaxially.

Apparatus for epitaxially growing the three-dimensional devices of this invention can be arranged generally as illustrated in FIGS. 5 and 6. The arrangement can comprise two or more modified closed hot-wall epitaxy chambers 40 (FIG. 6) joined to a vacuum system 42 (FIG. 5). The vacuum tunnel system is made up of a number of stainless steel flanged crosses 44 with an internal trolley 45 for exchanging the substrate wafer under vacuum conditions between two or more of the chambers 40. A main vacuum pump (not shown) is connected to the system through a vacuum conduit 46 coupled to a central one of the crosses 44, and an auxiliary pump (not shown) is connected through a conduit 48 and a shut off valve 50 to an end one of the crosses 44. A further flanged cross 52 is disposed beneath the valve 50 and serves as a port for inserting a workpiece 54 into and removing it from the system.

The trolley 45 is disposed to move horizontally through the crosses 44, and has a lift 55 associated with it for accessing the workpiece through the cross 52, and lowering and raising the workpiece to and from the chamber 40 associated with one of the crosses 44 and to and from another hot-wall epitaxy chamber 56 associated with another one of the crosses 44.

To effect this transfer, a mount 58 (see FIG. 6) for the chamber 40 or 56 is formed as a cap for the chamber, and includes means permitting the trolley lift 55 to grasp a substrate holder on the mount 58.

The chamber 40 is shown in detail in FIG. 6, but the construction features of the chamber 56 would be substantially identical.

The modified closed hot-wall epitaxy chamber 40 has a main body 60, the upper end of which is connected at a lower flange to the cross 44. Below a constriction 62 a pair of reservoirs 64,66 contain the elements cadmium and tellurium, respectively. The constriction 62 avoids a direct line of sight between the cadmium or tellurium and the substrate of the workpiece 54. The mount or cap 58 closes off the body 60 of the chamber 40 and maintains the vapors of the cadmium and tellurium therewithin. Heaters 68,70 heat the respective reservoirs to suitable temperatures to evaporate the cadmium and tellurium. The temperatures of the reservoirs 64,66 should be controlled so that the vapor pressures of the Cd and Te vapors are substantially equal at the position of the workpiece.

The chamber 56 is the same in construction and function, but contains indium and antimony in its respective reservoirs, which are heated by respective heating elements.

The trolley carries the cap 58 and the associated workpiece 54 between the chambers 40 and 56 under unbroken vacuum conditions. In order to form the sandwiches 14 of CdTe/InSb/CdTe so that the thin film layer 20 consistently functions in the desired manner, the growth process for forming the sandwich 14 must keep the materials free of contact with air. After the insulating outer CdTe layers 22 are formed, the workpiece 54 can be masked and etched in ordinary cleanroom conditions. The thick film InSb elements 26,28 can be formed under less pristine conditions than required for the sandwiched thin film InSb semiconductor layer 20.

As mentioned above, while an InSb/CdTe combination has been selected here because of the desirable characteristics of the InSb material and the near optimal crystal lattice match, other materials could possibly be employed according to the principles of this invention.

While the invention has been described with respect to a preferred embodiment, that many modifications and variations would present themselves to those of skill in the art without departing from the scope and spirit of this invention, as defined in the appended claims.

What is claimed is:

1. A multiple-layer semiconductor device comprising a single-crystal substrate and a plurality of stacked sandwiches of material, each said sandwich comprising a lower layer of a II-VI single crystal material serving as an insulator; a layer of a III-V single crystal material, at least portions of which have a thickness between about 50 Å and 100 Å, so that said portions have a semiconductor characteristic; an outer layer of said II-VI material serving as an insulator; and regions of said III-V material at selected locations through said lower and outer II-VI layers to serve as conductors in contact with said portions of said III-V material layer.

2. The multiple-layer device of claim 1 wherein said III-V material is of a first element selected from the group consisting of Al, Ga, In, and Tl, and a second element selected from the group consisting of P, As, Sb, Bi.

3. The multiple-layer device of claim 1 wherein said II-VI material is of a first element selected from the group consisting of Zn, Cd, Hg and a second element selected from the group consisting of S, Se, Te and Po.

4. The multiple-layer semiconductor device of claim 1 wherein said II-VI and III-V layers are grown epitaxially on one another.

5. The multiple-layer semiconductor device of claim 1 further comprising additional insulating layers of said II-VI material between successive ones of said sandwiches and additional layers of said III-V material on said additional II-VI material layers serving as conductive shields.

6. A multiple-layer semiconductor device comprising a substrate, a plurality of epitaxially-grown CdTe-InSb-CdTe sandwich layers arranged one above the next on said substrate and each including a lower CdTe layer serving as an insulator, and an InSb layer sandwiched therebetween and of a finite thickness less than 100 Å to serve as a semiconductor channel; with patterned grooves formed in the CdTe layers which are filled with epitaxially grown InSb material serving as conductors to contact said InSb layer; additional CdTe insulating layers and also InSb barrier layers interleaved between successive ones of said sandwich layers; and means interconnecting the InSb conductors of said sandwich layers.

7. The multiple-layer semiconductor device of claim 6 wherein said substrate is semi-insulating single crystal Si.

8. The multiple-layer semiconductor device of claim 6 wherein said substrate is semi-insulating single crystal GaAs.

9. The multiple-layer semiconductor device of claim 6 wherein there are from ten to fifty of said sandwich layers.

10. The multiple-layer semiconductor device of claim 6 wherein said CdTe layers and said InSb layers are substantially single crystalline.

11. A multiple-layer semiconductor device comprising a single-crystal substrate, and a plurality of alternate epitaxially grown layers of a III-V material and a II-VI material, said II-VI material serving as an insulator, at least certain ones of said layers of III-V material having a thickness less than about 100 Å so as to have semiconductor properties, at least certain others of said layers of said III-V material having a thickness of significantly greater than 100 Å so as to have conductor properties; and regions of said III-V material disposed through the II-VI material at selected locations to serve as conductors in contact with said III-V layers of less than 100 Å; wherein said II-VI material and said III-V material are selected so as to have a lattice mismatch of less than about 0.1 percent.

* * * * *